United States Patent [19]
Gongwer et al.

[11] Patent Number: 5,231,312
[45] Date of Patent: Jul. 27, 1993

[54] INTEGRATED LOGIC CIRCUIT WITH FUNCTIONALLY FLEXIBLE INPUT/OUTPUT MACROCELLS

[75] Inventors: Geoffrey S. Gongwer, San Jose; Jinglun Tam, Milpitas; Keith H. Gudger, Sunnyvale; Joe Yu, Palo Alto; Steven A. Sharp, Los Gatos, all of Calif.

[73] Assignee: Atmel Corporation, San Jose, Calif.

[21] Appl. No.: 850,285

[22] Filed: Mar. 12, 1992

[51] Int. Cl.⁵ ............................. H03K 19/177
[52] U.S. Cl. ............................ 307/465; 307/465.1
[58] Field of Search ............ 307/443, 243, 465, 465.1

[56] References Cited

U.S. PATENT DOCUMENTS

| | | | |
|---|---|---|---|
| 4,609,986 | 9/1986 | Hartmann et al. | 364/200 |
| 4,617,479 | 10/1986 | Hartmann et al. | 307/465 |
| 4,717,912 | 1/1988 | Harvey et al. | 340/825.83 |
| 4,742,252 | 5/1988 | Agrawal | 307/465 |
| 4,758,746 | 7/1988 | Birkner et al. | 307/465 |
| 4,761,768 | 8/1988 | Turner et al. | 365/201 |
| 4,771,285 | 9/1988 | Agrawal et al. | 340/825.83 |
| 4,789,951 | 12/1988 | Birkner et al. | 364/716 |
| 4,855,954 | 8/1989 | Turner et al. | 365/185 |
| 4,879,481 | 11/1989 | Pathak et al. | 307/465 |
| 4,879,688 | 11/1989 | Turner et al. | 365/201 |
| 4,896,296 | 1/1990 | Turner et al. | 365/189.08 |
| 4,912,345 | 3/1990 | Steele et al. | 307/465 |
| 4,918,641 | 4/1990 | Jigour et al. | 364/716 |
| 4,931,671 | 6/1990 | Agrawal | 307/465 |
| 4,963,768 | 10/1990 | Agrawal et al. | 307/465 |
| 4,992,679 | 2/1991 | Takata et al. | 307/465 |
| 5,023,484 | 6/1991 | Pathak et al. | 307/465 |
| 5,027,315 | 6/1991 | Agrawal et al. | 363/900 |
| 5,046,035 | 9/1991 | Jigour et al. | 364/716 |
| 5,151,623 | 9/1992 | Agrawal | 307/465 |

OTHER PUBLICATIONS

Atmel Corporation, *CMOS EPLD and Gate Arrays*, see especially pp. 4, 20, 38, 54 and 55, publ. 1991 at San Jose, Ca.
Intel Corporation, *5C121, 1200 Gate CHMOS, H-Series Erasable Programmable Logic Device*, see especially pp. 3, 6 and 7 publ. Jan. 1986.
Altera Corporation, *EPM5016 to EPM5192: High-Speed, High Density MAX EPLDs*, pp. 115–121, publ. Oct. 1990.
Altera Corporation, *EP900-series EPLDs, High Performance 24-Macrocell Devices*, pp. 71–79, publ. Oct. 1990.
Altera Corporation, *EP600-Series EPLDs, High Performance 16-Macrocell Devices*, pp. 49–57, publ. Oct. 1990.
Altera Corporation, *EP300-Series EPLDs, High Performance 8-Macrocell Devices*, pp. 33–39, publ. Oct. 1990.
Exel Microelectronics, Inc., *XL78C800, ERASIC Multi-Level E²PLDs*, see especially FIG. 4, publ. 1986 at Redmond, Wa.
Advanced Micro Devices, *MACH Device Family, High Density EE CMOS Programmable Logic*, see especially FIGS. 3 and 7, nd.

*Primary Examiner*—David R. Hudspeth
*Attorney, Agent, or Firm*—Schneck & McHugh

[57] ABSTRACT

An integrated circuit package including a plurality of macrocells for connecting a logic circuit of the package to a plurality of external contacts of the package. At least one of the macrocells has an output driver that is enabled or disabled by a control signal for transmitting or preventing transmission of a logic signal to one of the contacts. The control signal is generated by a logic gate that receives and logically combines an individual output enable signal dedicated to that particular macrocell with a selected signal. One signal that may be selected is a regional output enable signal that is supplied to more than one macrocell. Each macrocell also has a feedback multiplexer selecting one signal to be sent to the logic circuit. Choices include a nonstored logic signal, a stored logic signal from a flip-flop register in the macrocell, a signal applied to the external contact associated with that macrocell, and a signal applied to another external contact associated with a different macrocell. A plurality of contacts are connected to feedback multiplexers in two different macrocells, and at least one contact connects in this manner to separate logic regions of the logic circuit. The flip-flop register in the macrocell has a choice of data inputs selected by another multiplexer from among at least one logic signal from the logic circuit and at least one signal applied to an external contact.

39 Claims, 3 Drawing Sheets

INTEGRATED LOGIC CIRCUIT WITH FUNCTIONALLY FLEXIBLE INPUT/OUTPUT MACROCELLS

TECHNICAL FIELD

The present invention relates to integrated circuit packages of the type which are user programmable for performing a specified logic function, and in particular to input or output structures or "macrocells" for these integrated circuit packages which couple a logic circuit to a plurality of external contacts, such as conductive leads or pins.

BACKGROUND ART

In U.S. Pat. No. 4,717,912, Harvey et al. describe output structures for an integrated circuit package which are able to provide any combination of stored and nonstored, inverted and noninverted, logic signals to a plurality of pins. In one embodiment, each output structure includes a storage register having an input connected to a logic circuit for receiving a logic signal. A conductive line is also connected to the same input. The conductive line carrying the unstored logic signal, and the output of the storage register carrying the stored logic signal connect to inputs of a first multiplexer, which is responsive to a control signal from a programmable selection bit to select one of the two signals for its output. The multiplexer output is connected to an input of an XOR gate, whose other input receives a control signal from another programmable selection bit to cause the XOR gate to either invert or not invert the selected stored or nonstored signal. The XOR gate output connects to a pin of the IC package. The XOR gate can be enabled or disabled by another control signal. Either an inverted version of the stored signal from the storage register or the signal applied to the pin (possibly an external signal) is selected by another multiplexer and fed back to the logic circuit.

In U.S. Pat. No. 4,896,296, Turner et al. describe a configurable input/output cell for a programmable logic device having an output driver which is enabled or disabled by a control signal obtained through a multiplexer. One input to the multiplexer is a logic high signal $V_{cc}$ for which the output driver is always enabled, another input is a logic low signal or ground for which the output driver is always disabled, a third input is an output enable signal OE common to all of the input/output cells, and a fourth input is a product term signal providing an individual output enable signal. The multiplexer selects which one of the signals on the four inputs controls the output driver. Another feature of Turner et al.'s input/output cell is a feedback multiplexer which selects either the stored output $\overline{Q}$ of the cell's register, or one of two signals applied to the device terminals or pins associated either with that cell or with an adjacent cell, or a fixed ground signal for feedback to the logic array.

In U.S. Pat. No. 4,771,285, Agrawal et al. describe a programmable logic cell having an input select multiplexer that selects either a combinatorial logic signal or an external pin signal for input into and storage by a register or latch. The logic cell also has a feedback multiplexer selecting either the combinatorial logic signal or the output of the register for feedback to the logic circuit. An output enable multiplexer selects either a logic high signal $V_{cc}$, a ground signal, a signal from a pin or a sum or product term logic signal from the logic circuit for enabling or disabling the output driver.

In U.S. Pat. No. 4,742,252, Agrawal describes an integrated circuit having two or more programmable arrays. Each array receives a plurality of inputs supplied plied through an input multiplexor and generates a plurality of output terms. Each input multiplexer is coupled to and selects from a set of input signals received from input pins for both arrays and a subset of the plurality of output terms fed back from each array to both multiplexers. The device can thus be configured so that the two arrays operate in series, in parallel or some combination of series and parallel operation.

In U.S. Pat. No. 5,046,035, Jigour et al. describe a programmable logic device that includes a plurality of macrocells, which have a register that can be configured as either a D, T or JK flip-flop. The register receives two logic signal inputs A and B from the OR array of the device and provides an output Q to output and feedback multiplexers. One of the signal inputs B is ignored by the register in the D and T flip-flop configurations.

While many improvements in the functional flexibility of input/output circuits for programmable logic devices have already been achieved, further improvement is continually sought, so that the user may have as much control over the programming of such devices as possible. It is an object of the invention to provide such additional improvements in the functional flexibility of input/output macrocells.

DISCLOSURE OF THE INVENTION

The object is met in an integrated circuit package having a plurality of macrocells connecting a logic circuit to a plurality of external contacts, where the control signal for causing an output driver in each macrocell to transmit or prevent transmission of a logic signal to one of the pins can be generated by logically combining an individual output enable signal that is dedicated to a single macrocell and a regional output enable signal that is supplied to a plurality of macrocells. A logic gate, such as an AND gate, has one input connected to the individual output enable signal and a second input couplable to the regional output signal. Preferably, the regional signal or a fixed voltage level is selectable through a multiplexer. This user programmable option of logically combining individual and regional signals allows entire groups of output drivers to be selectively enabled or disabled, while at the same time allowing individual output drivers within enabled groups to also be enabled or disabled. Output enable signals used to generate the control signal for an output driver can be received by external contacts, be derived from clock signals, be programmed to have a fixed signal level with a configuration memory bit, or be generated by the logic circuit.

The object is also met, where each macrocell in the integrated circuit package has selection means in the feedback path, such as a feedback multiplexer, with at least two inputs connected to external contacts of the package, for selecting one of the signals received on the multiplexer inputs for transmission to the logic circuit. Each of the external contacts that connects to a feedback multiplexer in one of the macrocells also connects to a feedback multiplexer in another of the macrocells. Further, the logic circuit is made up of a plurality of separate logic regions, each region being distinguished by different, though possibly overlapping, sets of inputs.

At least one external contact connects through feedback multiplexers in a pair of macrocells to two different logic regions. Each feedback multiplexer could also have additional inputs coupled to receive stored or nonstored, product term or sum term logic signals from the logic circuit. The use of a feedback multiplexer that connects to at least two external contacts and the related connecting of each external contact to two feedback multiplexers in different macrocells provides additional flexibility to the contacts. In particular, the option of connecting a contact to two different logic regions in the circuit saves one valuable contact for another signal input or output.

Further, the object is met in a macrocell for an integrated circuit package that employs another multiplexer to select the data input of a macrocell's storage register or flip-flop. In addition to signal choices on at least one multiplexer input that are logic signals received from the logic circuit, there is also an input that couples to an external contact to receive a signal applied to that contact, typically from outside of the circuit package. This gives the user the option of programming selection of an external contact signal for storage by the macrocell's register instead of a logic signal from the logic circuit within the package. The register may be configurable as a D flip-flop or T flip-flop. In combination with the feedback multiplexer in which one of the feedback selections is the output of the register, the improvement gives the user the option of feeding either a stored or nonstored version of the external signal into the logic circuit.

BEST MODE FOR CARRYING OUT THE INVENTION

Figure 1:
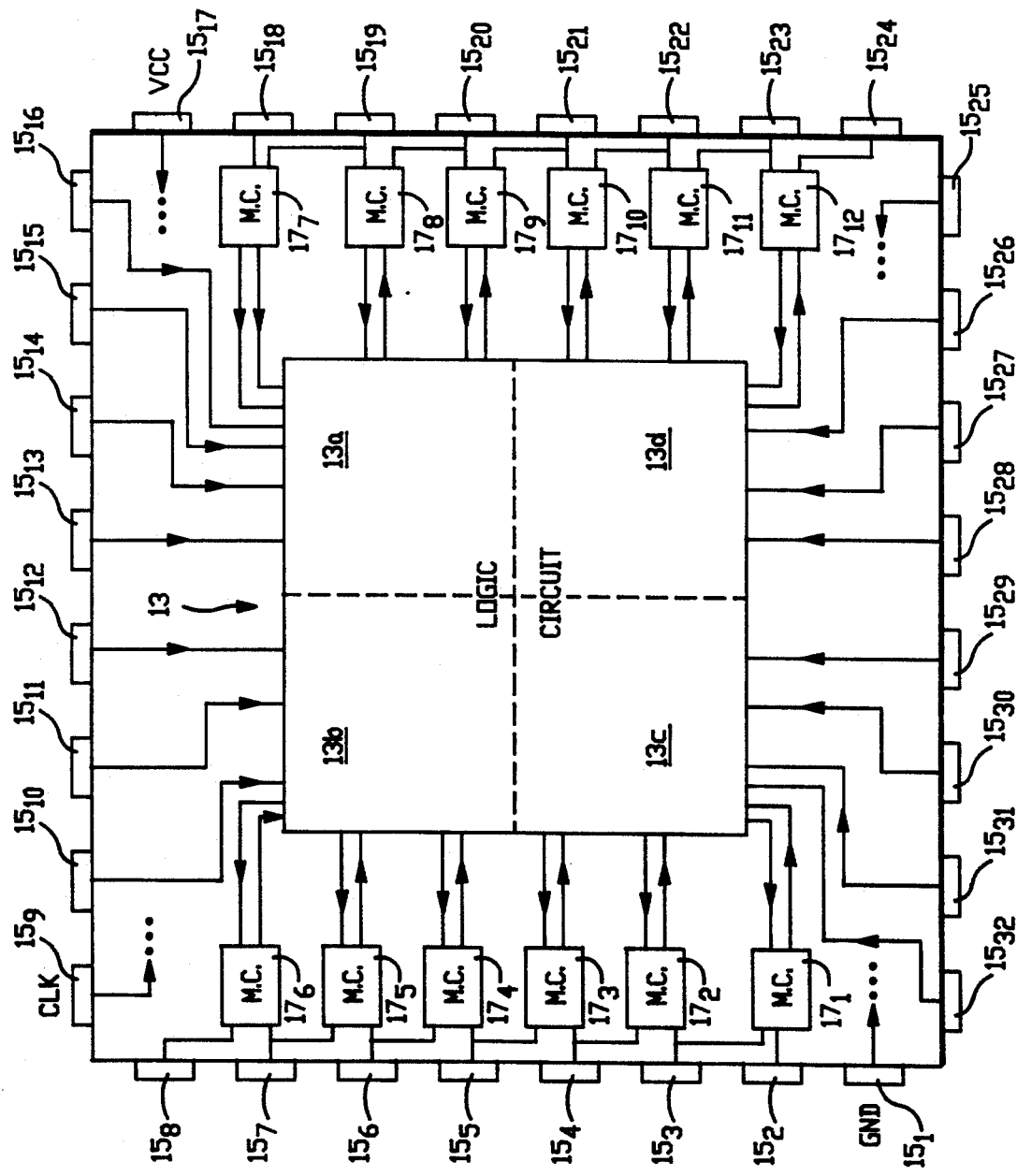
FIG. 1 is a plan schematic showing a typical block layout of an integrated circuit package in accord with the present invention.

With reference to FIG. 1, and integrated circuit package 11 has a logic circuit 13 for producing a plurality of logic signals. The logic circuit 13 may be made up of a plurality of separate logic regions $13a$–$d$, as shown here, which are distinguished form one another by the particular set of inputs each receives. The integrated grated circuit package 11 also has a plurality of external contacts $15_1$–$15_{32}$. These contacts may be any of the pins, pads or leads that are well known in the integrated circuit art. While thirty-two contacts 15 are shown, the number of contacts may vary from one device to another. Some of the contacts, for example contacts $15_1$, $15_9$, $15_{17}$ and $15_{25}$ in FIG. 1, are dedicated to supplying a reference potential or ground, a normal operating voltage $V_{cc}$, an external clock or other timing signal CLK, and other such non-data signals. Other contacts, for example contacts $15_8$, $15_{10}$–$15_{16}$, $15_{24}$, and $15_{26}$–$15_{32}$, may be dedicated to providing only input data signals to the logic circuit 13 Still other contacts, for example contacts $15_2$–$15_7$ and $15_{18}$–$15_{23}$, may be bidirectional and programmable to serve as either data input or data output terminals, depending on the state of output drivers in the package 11, as will be explained below. The exact number and arrangement of the various types of contacts may differ from one package to another.

The integrated circuit package 11 also has macrocells $17_1$–$17_{12}$ which connect the logic circuit 13 to at least some of the plurality of pins $15_1$–$15_{32}$. Typically, each bidirectional contact $15_2$–$15_7$ and $15_{18}$–$15_{23}$ has its own macrocell $17_1$–$17_{12}$. Other contacts which might be dedicated solely to data output, or even some or all of the data input contacts might also have macrocells, but of a different kind than the specific macrocell shown in FIG. 2. Macrocells $17_1$–$17_{12}$ receive logic signals produced and output from the various logic regions $13a$–$13d$ of the logic circuit 13. Typically, each macrocell $17_1$–$17_{12}$ receives only logic signals from one of the regions $13a$–$13d$. Each macrocell $17_1$–$17_{12}$ typically provides feedback logic signals to the various regions $13a$–$13d$ of the logic circuit 13. Some macrocells provide feedback signals to one of the regions $13a$–$13d$. Others provide feedback to more than one region. Some may provide feedback to all regions. Each macrocell $17_1$–$17_{12}$ can also either provide a logic output signal to one of the external contacts $15$–$15_7$ and $15_{18}$–$15_{23}$ or receive an input signal from that same external contact, depending on the state of that macrocell's output driver, as will be explained below. As will also be explained, each macrocell $17_1$–$17_{12}$ also receives a signal that is applied to an adjacent contact $15_3$–$15a$ and $15_{19}$–$15_{24}$. This will allow at least one of the external contacts, here contacts $15_5$ and $15_{21}$, to input a signal to either one or both of two separate logic regions $13a$–$13d$.

Figure 2:
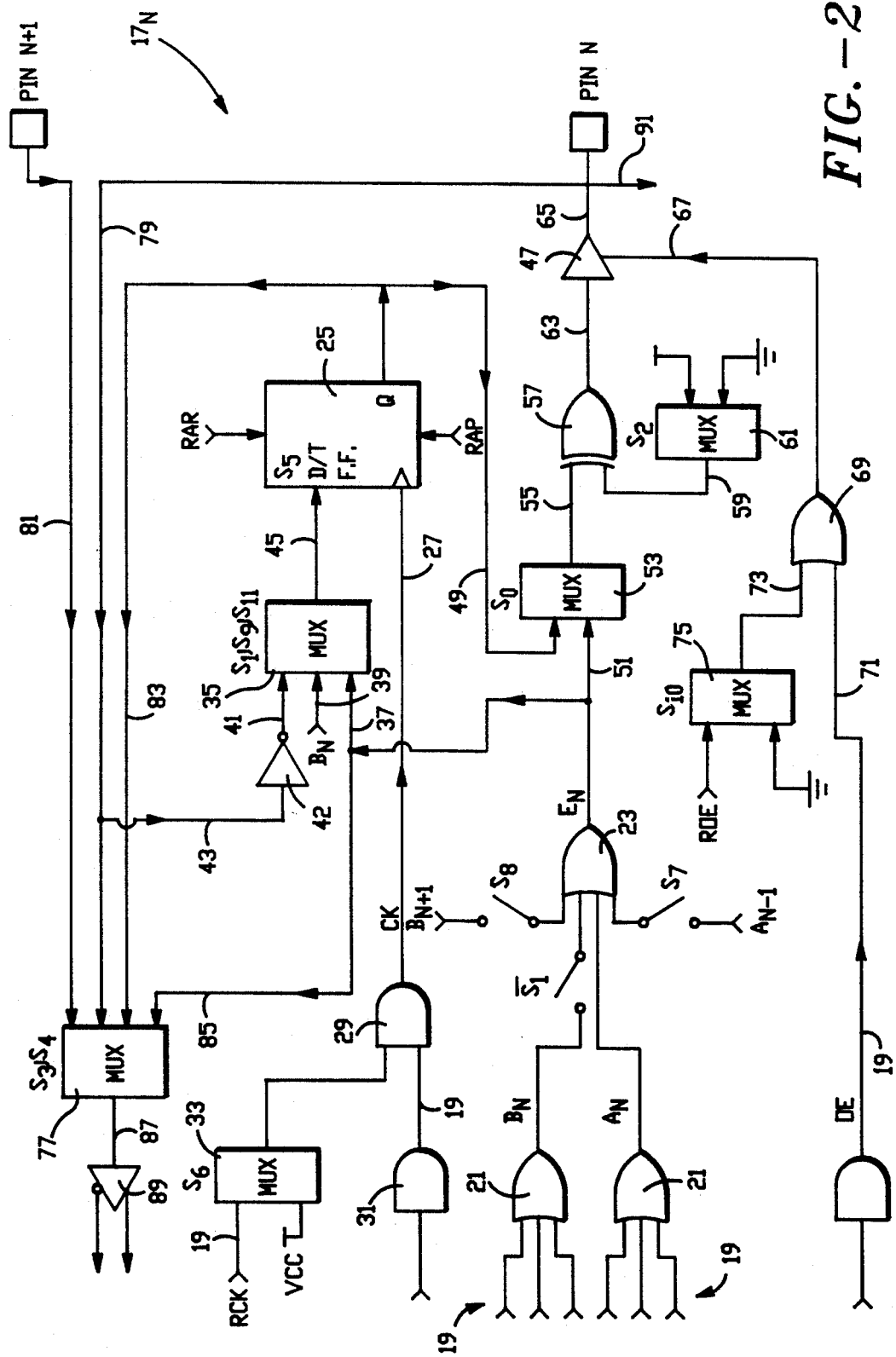
FIG. 2 is a schematic diagram of an improved macrocell of the present invention for use in the integrated circuit package of FIG. 1.

With reference to FIG. 2, the improved macrocell $17_N$ (where N is an integer) of the present invention has at least one input, and typically plural inputs 19 from the logic circuit 13. The logic circuit might, for example, be a programmable logic device (PLD) of the type having a programmable AND array generating product terms from the set of inputs it receives followed by a fixed OR array generating sum terms from the set of product terms it receives. In PLDs with a fixed OR array, it is conventional to include the OR gates 21 of that array in the macrocells 17. This placement has no real effect since in one integrated circuit the demarcation between logic circuit 13 and macrocells 17 is purely conceptual. Sum terms $A_N$ and $B_N$ from OR gates 21 in macrocell $17_N$, as well as sum terms $A_{N-1}$ and $B_{N+1}$ from OR gates in adjacent macrocells cells $17_{N-1}$ and $N_{N+1}$, may be logically combined by a second-stage OR gate 23 to form a sum term $E_N$. Switches $\bar{S}_1$, $S_7$ and $S_8$ may be used to select which of the sum terms, if any, will combine with sum term $A_N$. Configuration memory bits, such as EPROM cells, may be used to control, that is open or close, the switches.

The macrocell $17_N$ includes a flip-flop or other storage register 25. Flip-flop 25 has a regional asynchronous preset signal input RAP and a regional asynchronous reset signal input RAR. Flip-flop 25 also has a clock input 27 that receives a clock signal CK from the output of an AND gate 29. AND gate 29 receives a clock enable logic signal or an input 19 from the logic circuit 13. This clock enable logic signal is typically a product term, as represented by the AND gate 31 that is part of the programmable AND array of the logic circuit 13. AND gate 29 also receives either a regional clock signal RCK or a fixed logic high voltage level $V_{cc}$ from external contact $15_{17}$, depending on which is selected by a two-input multiplexer 33. Multiplexer selection may be controlled by a configuration memory bit $S_6$. The AND gate 29 then logically combines the two received signals to generate the clock input signal CK for flip-flop 25. When logic high voltage level $V_{cc}$ is selected by multiplexer 33, the flip-flop's clock input is the same as the clock enable product term received from the logic circuit 13, which product term may or may not be derived from a clock signal. When the regional clock signal RCK is selected, it is transmitted to the flip-flop's clock input whenever the clock enable product term has a high logic level. The regional clock signal RCK may be provided in an external contact, such as input pin $15_9$ in FIG. 1, or derived from such an input by logic circuit 13, or otherwise generated by the logic circuit. The flip-flop 25 may also receive a control signal $S_5$ from a configuration memory bit that selects either D-type or T-type operation for the flip-flop 25.

The data input 45 of the flip-flop 25 is provided by a multiplexer 35 responsive to at least one control signal $S_1$ provided by a configuration memory bit. Typically, two or three control signals $S_1$, $S_9$ (and $S_{11}$) provided by configuration memory bits, such as EPROM cells, control signal selection by the multiplexer 35. The multiplexer 35 receives at least one, and typically two, logic signals $E_N$ and $B_N$ on inputs 37 and 39 from the logic circuit 13. The signals can both be sum terms $E_N$ and $B_N$, as shown, or one or both of the logic signals could be product terms. The multiplexer 35 also receives, on an input 41, a signal derived from or otherwise related to the signal that is applied to the external contact labeled PIN N. In FIG. 2, an inverter 42 inverts the signal received on line 43 from external contact PIN N. Normally, the signal on input 41 will be selected by a user only when the output driver 47 has been disabled, and the signal on external contact PIN N is an external signal received from outside the integrated circuit package. Accordingly, the signal on input 41 to multiplexer 35 will be referred to as an external signal, even though output driver 47 might be enabled. The multiplexer 35 selects one of its input signals to be output to the data input 45 of the flip-flop 25. If only two multiplexer inputs are provided, i.e., one of the logic signal inputs 37 or 39 and the external signal input 41, then only one control signal $S_1$ is required for that selection. If all three of the inputs 37, 39 and 41 are provided, as shown, two control signals $S_1$ and $S_9$ will be required for that selection. If only two multiplexer inputs are provided, then only one control signal $S_1$ is required to select which signal is output to the D/T input 45. If all three of the multiplexer inputs 37, 39 and 41 are provided, then two control signals $S_1$ and $S_9$ are needed to select one of three inputs.

The output Q of flip-flop 25 is transmitted along line 49 to a first input of multiplexer 53. The output $E_N$ of OR gate 23 is transmitted along line 51 to a second input of multiplexer 53. Multiplexer 53 is responsive to a signal $S_0$ from a configuration memory bit to select either one of its inputs for output to a first XOR gate input 55. If the sum term $E_N$ on input 37 to multiplexer 35 is selected for input 45 to flip-flop 25, then the choice by multiplexer 53 reduces to one of simply selecting between a stored or nonstored version of the sum term $E_N$. However, the ability to select another, possibly unrelated, logic signal $B_N$ or an external signal for storage by the flip-flop effectively provides a greater variety of choices to multiplexer 53. The XOR gate 57 has, as previously noted, a first input 55 receiving the selected signal from the output of multiplexer 53. Gate 57 also has a second input 59 connected to still another multiplexer 61, that selectively provides in response to a configuration control signal $S_2$, a logic high or logic low voltage level to the second XOR gate input 59. A logic low level causes XOR gate 57 to pass the data signal on first input 55 to gate output 63 without inversion, while a logic high level on second input 59 causes XOR gate 57 to invert the logic signal on first input 55 and to pass the inverted signal to gate output 63.

The output 63 of XOR gate 57 connects to the input of output driver 47. The output driver 47 has an output 65 connected to an external contact, labeled here as PIN N. This external contact connected to output driver 47 is designed as the contact that is "associated" with the macrocell $17_N$. Other external contacts which have inputs into, but no outputs out of, macrocell $17_N$ are associated with different macrocells 17, shown in FIG. 1. Output driver 47 has a control input 67 receiving a control signal. Output driver 47 is responsive to the received control signal to either transmit or prevent transmission of the logic signal applied to its input 63 from XOR gate 57 to contact PIN N.

The control signal on line 67 for output driver 47 is generated by a circuit in the macrocell $17_N$ that includes a logic gate, such as OR gate 69. Other kinds of logic gates such as AND, NAND, NOR, XOR and XNOR gates could also be used. OR gate 69 has a first input 71 connected to an input 19 from the logic circuit 13 in FIG. 1 to receive an individual output enable signal OE. Typically, the individual output enable signal OE is a product term generated by the logic circuit 13. Alternatively, it could be obtained from a configuration memory bit in the macrocell $17_N$, from an external contact, such as one of the input pins $15_{10}$–$15_{16}$ or $15_{26}$–$15_{32}$, or be derived from an internal or external clock signal. The OR gate 69 also has a second input 73 connected to a multiplexer 75 responsive to a control signal $S_{10}$ from a configuration memory bit. Multiplexer 75 receives a logic low voltage level or ground on one input and a regional output enable signal ROE on another input. Unlike the individual output enable signal OE, the regional output enable signal ROE is not dedicated solely to a single macrocell $17_N$. Rather, the regional output enable signal ROE is supplied to the inputs of similar multiplexers in other macrocells 17, typically to some or all macrocells corresponding to a particular logic region 13a–13d of the logic circuit 13 in FIG. 1. The regional output enable signal ROE is typically generated by the particular logic 13a–13d to which it corresponds or is received from an external contact. Alternatively, it may be derived from an internal or external clock signal or obtained from a configuration memory bit. Multiplexer 75 selects which of its inputs, either the ground input or the ROE input, to connect to second OR gate input 73. The OR gate 69 then logically combines the individual output enable signal OE with the signal on the second input 73 to generate the control signal on line 67 for output driver 47. When the ground input to multiplexer 75 is selected, OR gate 69 simply passes the individual output enable signal OE on to the control input 67 of output driver 47. When the regional output enable signal ROE is selected by multiplexer 75, the OR gate logically sums it with the individual output enable signal OE to generate the control input 67 of output driver 47.

The macrocell $17_N$ also includes a feedback multiplexer 77 responsive to at least one, and typically two, control signals $S_3$ and $S_4$ obtained from configuration memory bits. The feedback multiplexer 77 has at least two inputs 79 and 81 receiving, respectively, the logic signal applied to the external contact PIN N associated with macrocell 17$_N$ and the logic signal applied to the external contact, labeled PIN N+1, of an adjacent macrocell, not shown. Other additional inputs typically include an input 83 from the output Q of flip-flop 25 and an input 85 connected to the output of OR gate 23 to receive the sum logic term E$_N$. Multiplexer 77 chooses one of its inputs 79, 81, 83 or 85 for connection to its output 87 for transmitting a selected signal back into the logic circuit 13 in FIG. 1. A feedback driver 89 on the multiplexer output 87 sends both an uninverted and an inverted version of the signal to the logic circuit.

Figure 3:
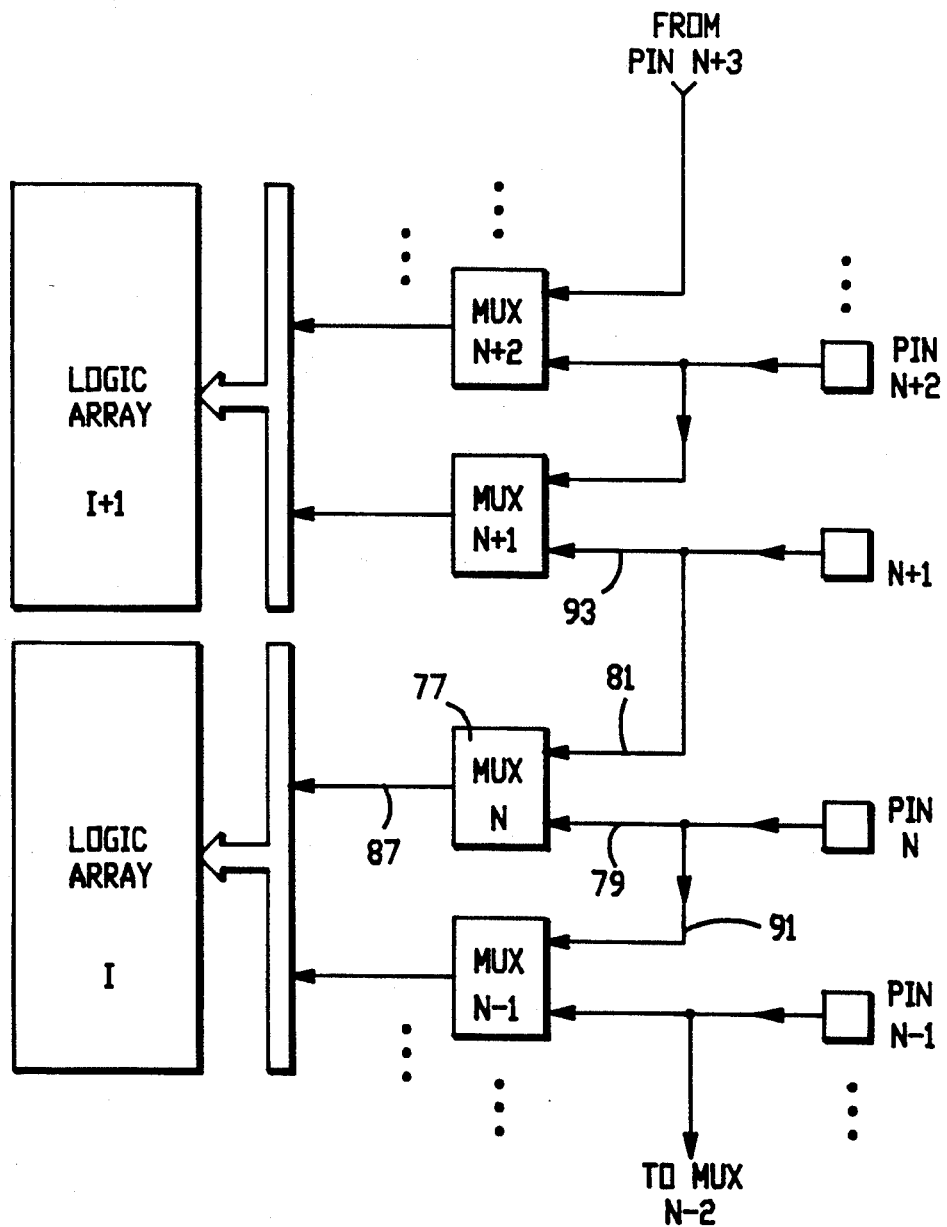
FIG. 3 is a block diagram of an enlarged portion of the integrated circuit package of FIG. 1 illustrating one aspect of the improved macrocell of FIG. 2.

With reference to FIG. 3, the feedback multiplexer 77 in FIG. 2, with its choice of at least two signals applied to external contacts, whether these signals are internally generated (output driver enabled) or originate from outside of the integrated circuit package (output driver disabled), provide added flexibility over feedback multiplexers that all have a choice of only combinatorial or nonstored logic signals E$_N$, registered or stored logic signals Q, and possibly the signal applied to the associated external contact PIN N. Note that each external contact, successively labeled . . . , PIN N−1, PIN N, PIN N+1, PIN N+2, . . . , that is associated with a macrocell, here represented only by the feedback multiplexers . . . , MUX N−1, MUX N (77), MUX N+1, MUX N+2, . . . , is connected to two feedback multiplexers. Thus, the external contact PIN N, associated with the macrocell 17$_N$ having feedback multiplexer MUX N, is connected via lines 79 and 91 to both MUX N and the feedback multiplexer MUX N−1 in a different and typically adjacent macrocell. Similarly, external contact PIN N+1 is connected not only via line 93 to the feedback multiplexer MUX N+1 in its associated macrocell, but also via line 81 to the feedback multiplexer MUX N in the macrocell 17$_N$ shown in FIG. 2. Likewise each external contact, except possibly for external contacts at the ends of a group of macrocells, is connected to two feedback multiplexers in different macrocells. Similarly, each feedback multiplexer is connected to at least two external contacts from different macrocells. In general, it is possible to provide feedback multiplexers with even more choices by connecting them to more than two external contacts.

In an integrated circuit package of the type where the logic circuit is divided into a plurality of separate subcircuits or logic regions, the connection of external contacts to two or more feedback multiplexers allows some overlap in the sets of external contacts coupled to each logic region. In particular, at least one external contact is connectable through the feedback multiplexers in two different macrocells to two different logic regions. For example, in FIG. 3, external contact PIN N+1 is coupled via line 93 and associated feedback multiplexer MUX N+1 to the logic array I+1, and is also coupled via line 81 and the feedback multiplexer MUX N in the adjacent macrocell to the separate logic array I. This capability eliminates needless duplication of signals required by more than one logic region, since the common external contact can carry the signal to both regions.

We claim:

1. In an integrated circuit package having a plurality of macrocells connecting a logic circuit to a plurality of external contacts, with each macrocell having an output driver responsive to a control signal for transmitting or preventing transmission of a logic signal to one of said plurality of external contacts, wherein the improvement in combination therewith comprises means, with each said macrocell, capable of logically combining an individual output enable signal dedicated to a single macrocell and a regional output enable signal for a plurality of macrocells, for generating said control signal for said output driver, said generating means including a logic gate with an output and at least two inputs, wherein one said input of said logic gate is connected to receive said individual output enable signal, and a second said input of said logic gate is connected to means for selecting either a fixed signal level or said regional output enable signal to be received by said second input.

2. The integrated circuit package of claim 1 wherein said logic gate is selected from the group consisting of logical AND, NAND, OR, NOR, XOR and XNOR gates.

3. The integrated circuit package of claim 1 wherein at least one of said output enable signals is generated by said logic circuit.

4. The integrated circuit package of claim 1 wherein at least one of said output enable signals is an external signal received by one of said external contacts.

5. In an integrated circuit package having a plurality of macrocells connecting a logic circuit to a plurality of external contacts, with each macrocell having an output driver responsive to a control signal for transmitting or preventing transmission of a logic signal to one of said plurality of external contacts, wherein the improvement in combination therewith comprises means, with each said macrocell, capable of logically combining an individual output enable signal dedicated to a single macrocell and a regional output enable signal for a plurality of macrocells, for generating said control signal for said output driver, wherein at least one of said output enable signals is derived from a clock signal.

6. In an integrated circuit package having a plurality of macrocells connecting a logic circuit to a plurality of macrocells connecting a logic circuit to a plurality of external contacts, with each macrocell having an output driver responsive to a control signal for transmitting or preventing transmission of a logic signal to one of said plurality of external contacts, wherein the improvement in combination therewith comprises means, with each said macrocell, capable of logically combining an individual output enable signal dedicated to a single macrocell and a regional output enable signal for a plurality of macrocells, for generating said control signal for said output driver, selection means, with each said macrocell, having an output, a first input coupled to one of said external contact to receive an external signal therefrom, and at least a second input coupled to said logic circuit to receive a logic signal therefrom, for selecting one of said external signal and said logic signal to be provided on said output thereof, and storage means, within each said macrocell, having an input connected to said output of said selection means and having an output couplable to said output driver, for storing said selected external signal or logic signal received on its input and for providing said stored signal on its output.

7. The integrated circuit package of claim 6 wherein said selection means comprises a multiplexer.

8. The integrated circuit package of claim 6 wherein said selection means has three inputs with a third input also coupled to said logic circuit to receive a second logic signal therefrom, said selection means selecting one of said external signal on said first input, said logic signal on said second input and said second logic signal on said third input to be provided on said output thereof.

9. The integrated circuit package of claim 6 wherein said selection means is responsive to at least one control signal received from at least one configuration memory bit.

10. The integrated circuit package of claim 6 wherein said storage means is a register.

11. The integrated circuit package of claim 6 wherein said storage means is configurable in response to a configuration memory bit as either a D flip-flop or a T flip-flop.

12. The integrated circuit package of claim 6 wherein said logic signal is a product term.

13. The integrated circuit package of claim 6 wherein said logic signal is a sum term.

14. The integrated circuit package of claim 8 wherein said logic signal on said second input is a product term and said second logic signal on said third input is a sum term.

15. An integrated circuit package comprising
a logic circuit for producing a plurality of logic signals,
a plurality of external contacts, and
a plurality of macrocells for connection between said logic circuit and said plurality of external contacts, each of said macrocells having at least one input connected to said logic circuit to receive at least one of said logic signals therefrom and at least some of said macrocells having an output connected to one of said external contacts, each of said macrocells also including
(i) an output driver having a driver output connected to the output of said macrocell, a first driver input coupled to at least one of said input of said macrocell to receive a logic output signal corresponding to at least one logic signal provided on said at least one input of said macrocell, and a second control input to receive a control signal, said output driver being in a first state transmitting said logic output signal from said first driver input to said driver output whenever said control signal is at a first signal level, said output driver being in a second state preventing transmission of said logic output signal from said first driver input to said driver output whenever said control signal is at a second signal level, and
(ii) means, having an output connected to said second control input of said output driver, for generating said control signal, said generating means including a logic gate with a gate output coupled to said output of said generating means and at least two gate inputs respectively couplable to receive an individual output enable signal dedicated to said macrocell and a regional output enable signal for a plurality of macrocells, whereby said logic gate can logically combine said individual and regional output enable signals to generate said control signal, wherein a first or said at least two gate inputs is connected to receive said individual output enable signal, and a second of said at least two gate inputs is connected to means for selecting either a fixed signal level or said regional output enable signal to be received by said second input.

16. The integrated circuit package of claim 15 wherein said logic gate is selected from the group consisting of logical AND, NAND, OR NOR, XOR and XNOR gates.

17. The integrated circuit package of claim 15 wherein at least one of said output enable signals is generated by said logic circuit.

18. The integrated circuit package of claim 15 wherein at least one of said output enable signals is an external signal received by one of said external contacts.

19. An integrated circuit package comprising
a logic circuit for producing a plurality of logic signals,
a plurality of external contacts, and
a plurality of macrocells for connection between said logic circuit and said plurality of external contacts, each of said macrocells having at least one input connected to said logic circuit to receive at least one of said logic signals therefrom and at least some of said macrocells having an output connected to one of said external contacts, each of said macrocells also including
(i) an output driver having a driver output connected to the output of said macrocell, a first driver input coupled to at least one of said input of said macrocell to receive a logic output signal corresponding to at least one logic signal provided on said at least one input of said macrocell, and a second control input to receive a control signal, said output driver being in a first state transmitting said logic output signal from said first driver input to said driver output whenever said control signal is at a first signal level, said output driver being in a second state preventing transmission of said logic output signal from said first driver input to said driver output whenever said control signal is at a second signal level, and
(ii) means, having an output connected to said second control input of said output driver, for generating said control signal, said generating means including a logic gate with a gate output coupled to said output of said generating means and at least two gate inputs respectively couplable to receive an individual output enable signal dedicated to said macrocell and a regional output enable signal for a plurality of macrocells, whereby said logic gate can logically combine said individual and regional output enable signals to generate said control signal, wherein at least one of said output enable signals has a fixed signal level programmed by a configuration memory bit.

20. An integrated circuit package comprising
a logic circuit for producing a plurality of logic signals,
a plurality of external contacts, and
a plurality of macrocells for connection between said logic circuit and said plurality of external contacts, each of said macrocells having at least one input connected to said logic circuit to receive at least one of said logic signals therefrom and at least some of said macrocells having an output connected to one of said external contacts, each of said macrocells also including (i) an output driver having a driver output connected to the output of said macrocell, a first driver input coupled to at least one of said input of said macrocell to receive a logic output signal corresponding to at least one logic signal provided on said at least one input of said macrocell, and a second control input to receive a control signal, said output driver being in a first state transmitting said logic output signal from said first driver input to said driver output whenever said control signal is at a first signal level, said output driver being in a second state preventing transmission of said logic output signal from said first driver input to said driver output whenever said control signal is at a second signal level, and (ii) means, having an output connected to said second control input of said output driver, for generating said control signal, said generating means including a logic gate with a gate output coupled to said output of said generating means and at least two gate inputs respectively couplable to receive an individual output enable signal dedicated to said macrocell and a regional output enable signal for a plurality of macrocells, whereby said logic gate can logically combine said individual and regional output enable signals to generate said control signal, wherein at least one of said output enable signals is derived from a clock signal.

21. An integrated circuit package comprising
a logic circuit for producing a plurality of logic signals,
a plurality of external contacts, and
a plurality of macrocells for connection between said logic circuit and said plurality of external contacts, each of said macrocells having at least one input connected to said logic circuit to receive at least one of said logic signals therefrom and at least some of said macrocells having an output connected to one of said external contacts, each of said macrocells also including (i) an output driver having a driver output connected to the output of said macrocell, a first driver input coupled to at least one of said input of said macrocell to receive a logic output signal corresponding to at least one logic signal provided on said at least one input of said macrocell, and a second control input to receive a control signal, said output driver being in a first state transmitting said logic output signal from said first driver input to said driver output whenever said control signal is at a first signal level, said output driver being in a second state preventing transmission of said logic output signal from said first driver input to said driver output whenever said control signal is at a second signal level, and (ii) means, having an output connected to said second control input of said output driver, for generating said control signal, said generating means including a logic gate with a gate output coupled to said output of said generating means and at least two gate inputs respectively couplable to receive an individual output enable signal dedicated to said macrocell and a regional output enable signal for a plurality of macrocells, whereby said logic gate can logically combine said individual and regional output enable signals to generate said control signal, at least some of said macrocells further including (iii) a storage register having a register output couplable to said first driver input of said output driver to provide a stored logic output signal thereto, and having a register logic input for receiving a signal to be stored by said storage register, and (iv) a multiplexer having an output connected to said register logic input of said storage register, a first input coupled to one of said external contacts to receive an external signal therefrom, and at least a second input coupled to said at least one input of said macrocell to receive at least one logic signal from said logic circuit, said multiplexer being responsive to at least one selection control signal to select one of said external signal and said at least one logic signal on said inputs of said multiplexer to be provided on said output of said multiplexer to said storage register.

22. The integrated circuit package of claim 21 wherein said storage register is configurable in response to a configuration memory bit as either a D flip-flop or a T flip-flop.

23. The integrated circuit package of claim 21 wherein said at least one logic signal received by at least said second input of said multiplexer is a product term.

24. The integrated circuit package of claim 21 wherein said at least one logic signal received by at least said second input of said multiplexer is a sum term.

25. The integrated circuit package of claim 21 wherein said multiplexer has three inputs with said second input receiving a product term logic signal and a third input also coupled to an input of said macrocell to receive a sum term logic signal from said logic circuit, said multiplexer responsive to two selection control signals received from a pair of configuration memory bits to select one of said external signal on said first input, said product term logic signal on said second input and said sum term logic signal on said third input to be provided on said output of said multiplexer.

26. In an integrated circuit package having a plurality of macrocells connecting a plurality of external contacts to a logic circuit with a plurality of separate logic regions, said separate logic regions of said logic circuit distinguished from each other by different sets of inputs for receiving and operating on different sets of input data signals, the improvement comprising
    selection means, within each macrocell, having an output coupled to one of said logic regions of said logic circuit, a first input connected to a particular one of said external contacts which is associated with said macrocell to receive a first signal applied to said external contact, and at least a second input connected to another one of said external contacts to receive a second signal applied to that other external contact, for selecting, in response to at least one control signal, one of said signals received on one of said inputs thereof to be transmitted on said output thereof to the logic region to which said output is coupled,
    wherein a plurality of said external contacts that are connected to a first input of a selection means of an associated macrocell are also connected to an input of a selection means of another macrocell, and wherein at least one external contact is coupled through a pair of said selection means to two separate logic regions.

27. The integrated circuit package of claim 26 wherein said selection means is a multiplexer.

28. The integrated circuit package of claim 26 wherein the selecting of one of said signals by said selection means is responsive to at least one control signal received from a configuration memory bit.

29. The integrated circuit package of claim 26 wherein the selecting of one of said signals by said selection means is responsive to at least one control signal generated by said logic circuit.

30. The integrated circuit package of claim 26 wherein said selection means has at least one other input coupled to receive at least one logic signal generated by said logic circuit, said selection means also being capable of selecting said at least one logic signal for transmission on said output of said selection means.

31. The integrated circuit package of claim 30 wherein said at least one logic signal is a stored signal.

32. The integrated circuit package of claim 30 wherein said at least one logic signal is a nonstored signal.

33. In an integrated circuit package having a plurality of macrocells connecting a logic circuit with a plurality of separate logic regions to a plurality of external contacts, with at least some of said macrocells having an output driver responsive to a control signal for transmitting or preventing transmission of a logic signal to a particular one of said external contacts which is associated with that macrocell, the improvement comprising storage means within each macrocell having an output and an input coupled to receive a logic signal, said storage means responsive to a clock signal, for storing said received logic signal and providing said stored signal to said output thereof, said output of said storage means being couplable to an input of said output driver, feedback selection means within each macrocell having an output connected to a logic region of said logic circuit, a first input connected to said external contact associated with that macrocell to receive a signal applied to that external contact, a second input connected to a second external contact associated with a different macrocell to receive a signal applied to that second external contact, a third input connected to the output of said storage means to receive said stored signal, and a fourth input connected to said logic region of said logic circuit to receive an unstored logic signal, said feedback selection means being responsive to a pair of control signals to select the signal on said first input, second input, third input or fourth input to be transmitted to said output, wherein a plurality of external contacts are connected to feedback selection means in at least two different macrocells and at least one external contact is couplable through said at least two different macrocells to two separate logic regions of said logic circuit.

34. The integrated circuit package of claim 33 wherein said feedback selection means is a multiplexer.

35. The integrated circuit package of claim 33 wherein said pair of control signals to which said feedback selection means is responsive are obtained from programmable configuration memory bits.

36. The integrated circuit package of claim 33 wherein said logic signal received by said input of storage means is the same as said unstored logic signal received by said fourth input of said feedback selection means.

37. The integrated circuit package of claim 33 wherein said logic signal received by said input of said storage means is a logic signal generated by said logic circuit which is generally unrelated to said unstored logic signal received from said logic circuit by said fourth input of said feedback selection means.

38. The integrated circuit package of claim 33 wherein said logic signal received by said input of said storage means is related to said signal applied to said external contact associated with the same macrocell containing said storage means.

39. The integrated circuit package of claim 33 further comprising second selection means within each macrocell having an output connected to said input of said storage means, a first input coupled to said external contact associated with that macrocell, and at least a second input coupled to receive at least one logic signal from said logic circuit, said means responsive to at least one control input for selecting one of said inputs to be coupled to said output thereof, whereby a selected one of said signals is transmitted to said storage means.

* * * * *

UNITED STATES PATENT AND TRADEMARK OFFICE
CERTIFICATE OF CORRECTION

PATENT NO. : 5,231,312
DATED : July 27, 1993
INVENTOR(S) : Geoffrey S. Gongwer et al.

It is certified that error appears in the above-indentified patent and that said Letters Patent is hereby corrected as shown below:

Column 2, lines 5-6, "supplied plied through" should read -- supplied through --.

Column 2, line 6, "multiplexor" should read -- multiplexer --.

Column 3, line 46, "and" should read -- an --.

Column 3, line 51, "The integrated grated" should read -- The integrated --.

Column 3, line 64, "circuit 13 Still" should read -- circuit 13. Still --.

Column 4, line 22, "external contacts $15-15_7$" should read -- external contacts $15_2-15_7$ --.

Column 4, line 27, "adjacent contact $15_3-15_a$" should read -- adjacent contact $15_3-15_8$ --.

Claim 6, column 8, lines 42-44, "of macrocells connecting a logic circuit to a plurality of macrocells connecting a logic circuit to a plurality of external contacts" should read -- of macrocells connecting a logic circuit to a plurality of external contacts --.

UNITED STATES PATENT AND TRADEMARK OFFICE
CERTIFICATE OF CORRECTION

PATENT NO. : 5,231,312

DATED : July 27, 1993

INVENTOR(S) : Geoffrey S. Gongwer et al.

It is certified that error appears in the above-indentified patent and that said Letters Patent is hereby corrected as shown below:

Claim 6, column 8, line 56, "contacts" should read -- contact --

Claim 15, column 9, line 65, "a first or" should read -- a first of --.

Signed and Sealed this

Tenth Day of May, 1994

Attest:

BRUCE LEHMAN

Attesting Officer

Commissioner of Patents and Trademarks